United States Patent [19]

Shiga

[11] Patent Number: 5,291,153
[45] Date of Patent: Mar. 1, 1994

[54] OSCILLATING MMIC CIRCUIT WITH DIELECTRIC RESONATOR

[75] Inventor: Nobuo Shiga, Yokoyama, Japan

[73] Assignee: Sumitomo Electric Industries, Ltd., Osaka, Japan

[21] Appl. No.: 871,702

[22] Filed: Apr. 21, 1992

[30] Foreign Application Priority Data

Apr. 26, 1991 [JP] Japan .................. 3-096888

[51] Int. Cl.$^5$ .............................. H03B 5/18
[52] U.S. Cl. ...................... 331/99; 331/108 D; 331/117 FE; 331/117 D
[58] Field of Search ............. 331/96, 99, 107 SL, 331/117 FE, 117 D, 108 C, 108 D

[56] References Cited

U.S. PATENT DOCUMENTS

| | | | |
|---|---|---|---|
| 4,481,487 | 11/1984 | Brehm et al. | 331/117 D |
| 4,628,283 | 12/1986 | Reynolds | 331/117 D X |
| 4,906,946 | 3/1990 | Mekata et al. | 331/117 D X |

FOREIGN PATENT DOCUMENTS 069431  1/1983  European Pat. Off. .

OTHER PUBLICATIONS

C. Tstronos et al., "Stable Monolithic GaAs FET Oscillator", *Electronics Letters,* vol. 18, No. 8, Enage GB (Apr. 1982).

Patent Abstracts of Japan, vol. 013, No. 496 (E-843) Nov. 9, 1989 & JP-A-1 198 804 (Nippon Telegr & Teleph Corp.).

Patent Abstracts of Japan, vol. 011, No. 182 (E-515) Jun. 11, 1987 & JP-A62 013 105 (NEC Corp.).

D. Ch'en, "DBS High Volume Market for GaAs MMICs", *Microwave Journal,* vol. 26, No. 2, Dedham US, pp. 116–122 (Feb. 1983).

Philip G. Wilson and Richard D. Carver, "An Easy--To-Use FET DRO Design Procedure Suited To Most CAD Programs", IEEE MTT-S Digest, pp. 1033–1036 (1989).

*Primary Examiner*—Siegfried H. Grimm
*Attorney, Agent, or Firm*—Beveridge, DeGrandi, Weilacher & Young

[57] ABSTRACT

An oscillating circuit includes a substrate, a FET formed on the substrate, a series feedback capacitor connected to the source of the FET, a microstrip line formed on the substrate and connected to the gate of the FET, and a dielectric resonator which is electromagnetically coupled to the microstrip line. The dielectric resonator is located near the microstrip line.

5 Claims, 3 Drawing Sheets

OSCILLATING MMIC CIRCUIT WITH DIELECTRIC RESONATOR

BACKGROUND OF THE INVENTION

1. Field of the Invention

This invention relates to a local oscillating circuit for use in a satellite-broadcast receiving converter or a measuring equipment, etc.

2. Related Background Art

In association with the recent rapid development of information network systems, a satellite communication and broadcasting system has been required, and shifting of the frequency band of the system to a higher band also has been required. In order to satisfy these requirements, various circuit elements such as a field effect transistor, etc. which can be operated in a high frequency band have been studied and developed. A Schottky-barrier type electric field effect transistor (MESFET) formed of a compound semiconductor has been used such as a field effect transistor for a high frequency band. Especially a GaAs compound semiconductor transistor has been employed because it can break-through a limitation in characteristics of an Si bipolar transistor. In addition, in order to satisfy various requirements such as miniaturization, low-cost and high performance for a system, integration of a first-stage amplifying portion of a down-converter has been recently constructed as a MMIC(Microwave Monolithic Integrated Circuit).

An ordinary GaAs-MESFET formed by ion-implantation has been conventionally used in a local oscillating circuit which is used in a satellite-broadcast receiving converter and so on. A conventional oscillating circuit using the ordinary GaAs-MESFET as described above inherently has an excessively large phase-noise without modification, and this phase-noise is caused by "low Q" which is inherent to the GaAs-MESFET. There are various causes to induce the phase-noise of the oscillating circuit, and a low-frequency noise of an FET (considered as one of 1/f noise because the spectrum is inversely proportional to frequency) and a bias-dependence of a gate capacitance Cgs have been known as main causes.

Therefore, in order to implement an oscillating circuit having a low phase-noise, a dielectric resonator having high dielectric constant has been hitherto provided at the outside of the oscillating circuit to obtain a desired resonance spectrum.

As described above, the conventional oscillating circuit using the GaAs-MESFET is required to be added with the dielectric resonator to reduce the phase-noise at least when it is used in the satellite-broadcast receiving converter. This requirement is also made for an MMIC oscillating circuit in which all elements inherently requisite for the circuit construction of the oscillating circuit are integrated on one chip.

FIGS. 1A and 1B show an example of the conventional MMIC oscillating circuit, in which FIG. 1A is a circuit diagram, and FIG. 1B is a substantially plane view of the arrangement of the circuit. In the MMIC oscillating circuit as shown in FIGS. 1A and 1B, an FET 11, resistors 12a and 12b, and capacitors 13a to 13d are formed on an MMIC substrate 1, and the MMIC substrate 1 having the above elements is mounted on a ceramic substrate 3 on which a microstrip line 2 and other circuit patterns have been formed. The microstrip line on the ceramic substrate 3 and the MMIC substrate 1 are connected to each other by a wiring 4, and a dielectric resonator 5 is mounted adjacently to the microstrip line 2 so as to be electromagnetically coupled to the microstrip line 2. In addition, an end terminal resistance 6 is provided on the ceramic substrate 3.

As described above, since the conventional MMIC oscillating circuit has been so designed that the dielectric resonator and the microstrip line electromagnetically coupled to the dielectric resonator are provided at the outside of the MMIC substrate, an effect of utilization of an MMIC to promote the miniaturization of the system can not be sufficiently obtained.

SUMMARY OF THE INVENTION

An object of this invention is to provide an oscillating circuit which can be more miniaturized even using a dielectric resonator.

In order to attain the above object, an oscillating circuit according to this invention is so designed that a microstrip line which is electromagnetically coupled to a dielectric resonator is formed on the same semi-insulating GaAs substrate, together with other circuit elements. With this arrangement, it is not necessary to form the microstrip line which is electromagnetically coupled to the dielectric resonator on an insulating substrate on which the dielectric resonator etc. is mounted and as the result, it is possible to omit any area which would be otherwise occupied by the microstrip line, from the substrate. Accordingly the oscillating circuit can be minimized.

It is a further object of the present invention to provide an oscillating circuit comprising: a FET formed on a substrate; a series feedback capacitor connected to a source of the FET and formed on the substrate; a microstrip line connected to a gate of the FET and formed on the substrate; and a dielectric resonator electromagnetically coupled to the microstrip line and located near said microstrip line.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

A preferred embodiment of this invention will be described hereunder with reference to the accompanying drawings.

Figure 1A:
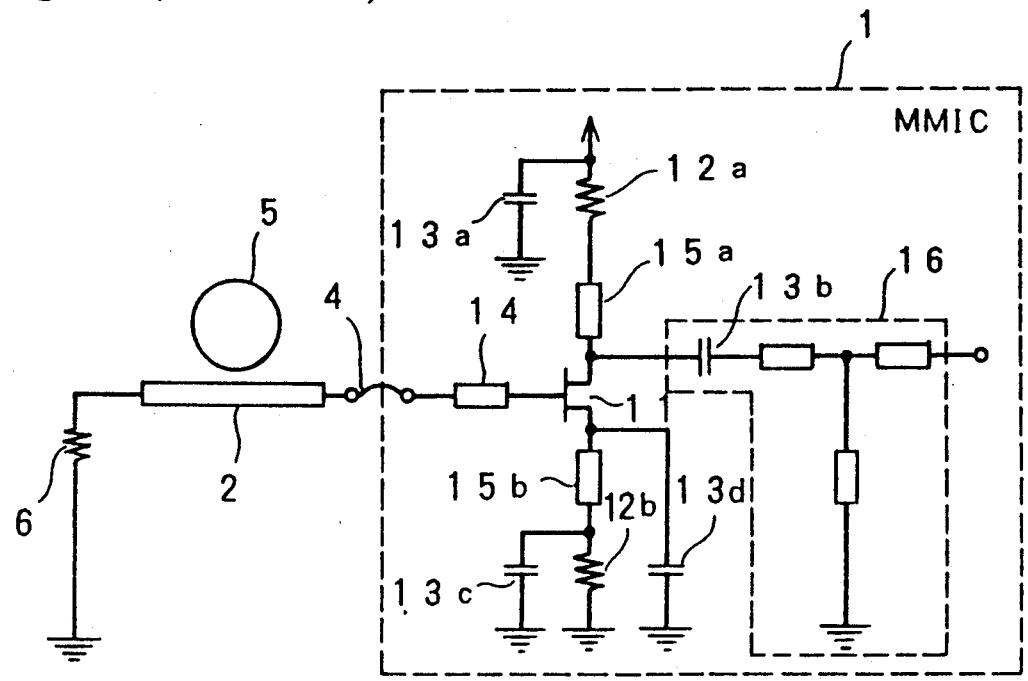
FIG. 1A is a circuit diagram of a conventional oscillating circuit.
Figure 1B:
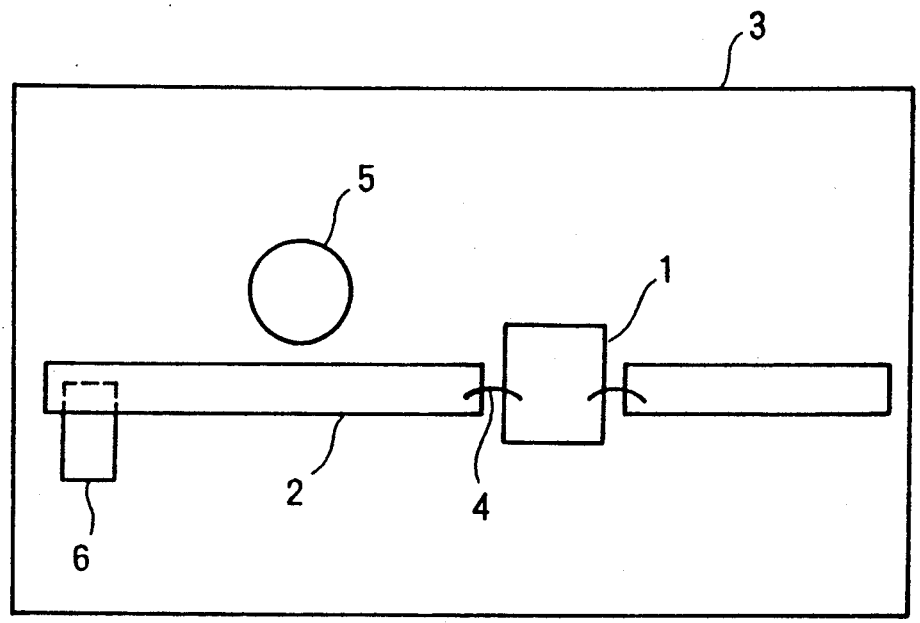
FIG. 1B is a plan view of the arrangement of the circuit as shown in FIG. 1A.
Figure 2:
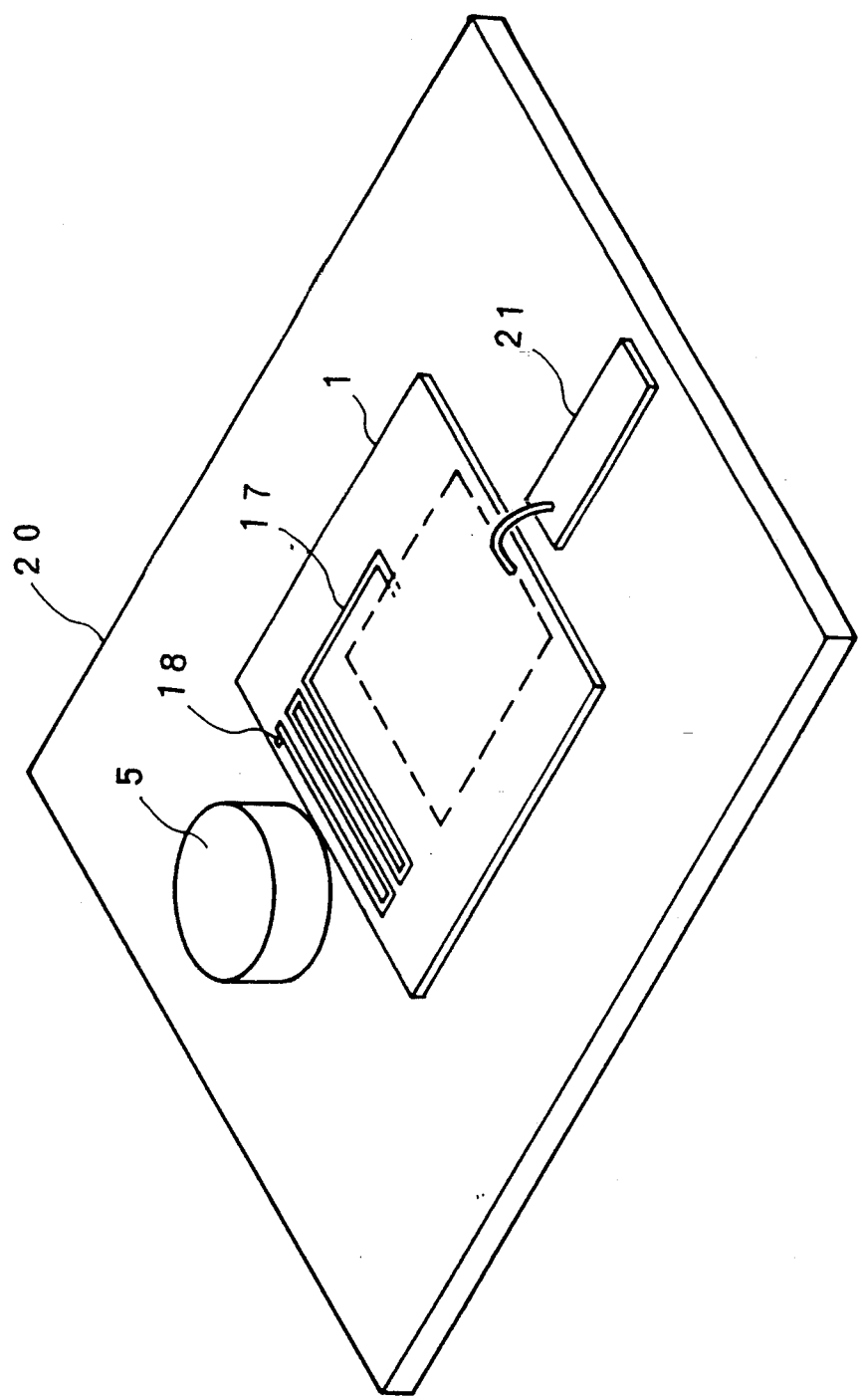
FIG. 2 is a perspective view of the cubic structure of an embodiment of an oscillating circuit according to this invention.

As shown in FIG. 2, an MMIC substrate 1 and a dielectric resonator 5 are mounted on a ceramic insulating substrate 20. In addition, a transmitting line for an output terminal is mounted on the ceramic insulating substrate 20, and an ground conductor is formed on the whole back surface of the insulating substrate 20. The MMIC substrate 1 consists of a semi-insulating GaAs substrate and some epitaxial layers formed on the semi-insulating substrate, and some of the epitaxial layers are formed by a layer-growth technique using an OMVPE (Organic Metal Vapor Phase Epitaxy) method.

Figure 3:
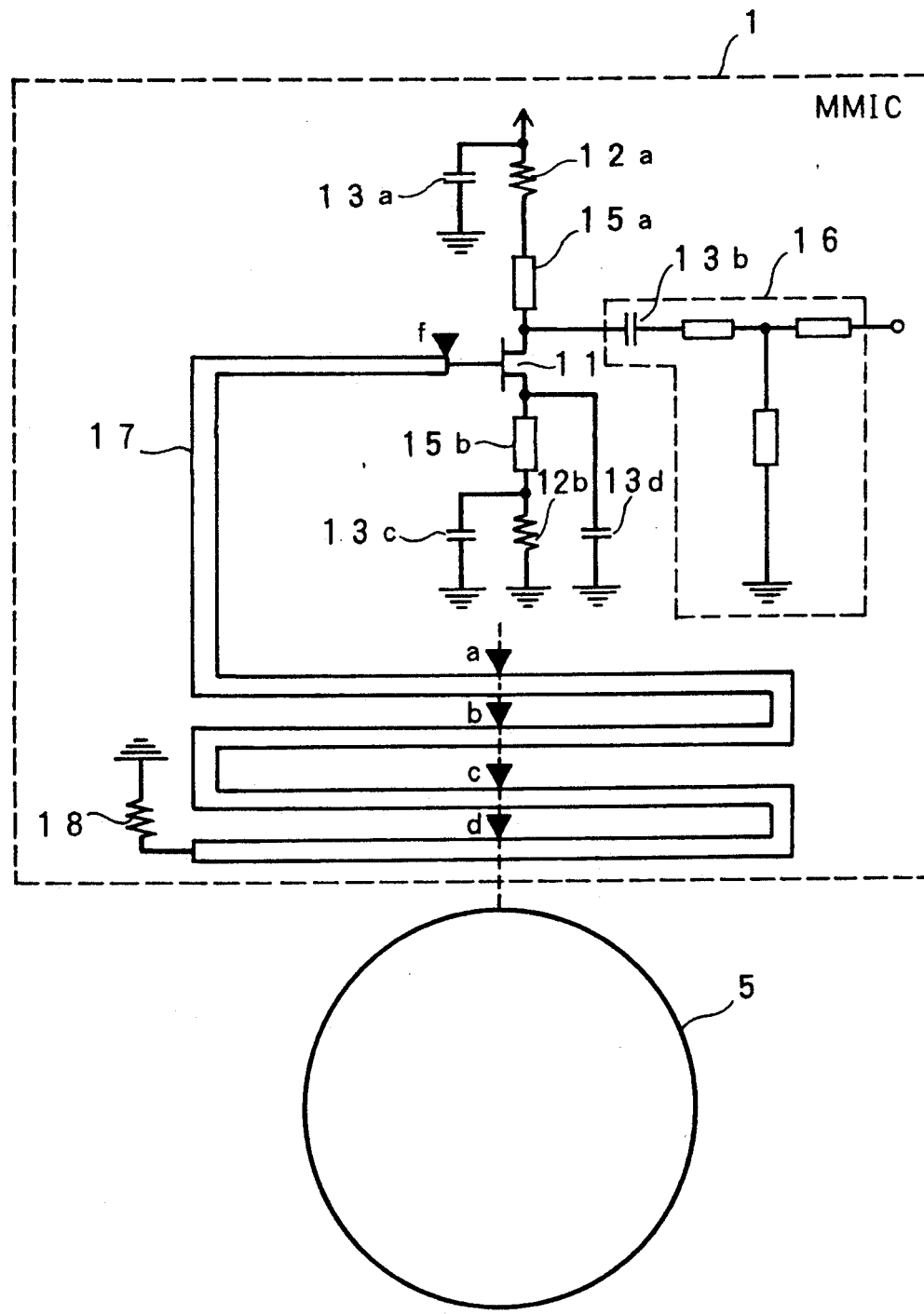
FIG. 3 is a diagram of a circuit on a MMIC substrate used in the embodiment of this invention and is a schematic view of the arrangement relationship between the circuit on the MMIC substrate and a dielectric resonator.

As shown in FIG. 3, all elements such as an FET 11, resistors 12a and 12b, capacitors 13a to 13d, $\lambda_g/4$ lines ($\lambda_g$ represents the wavelength on the GaAs substrate of an oscillating frequency of $f_g$) 15a and 15b, an output matching circuit 16, etc. which are inherently indispensable for the constitution of an oscillating circuit are formed on the MMIC substrate 1, and both of a microstrip line 17 to be coupled to an external dielectric resonator 5 and an end terminal resistor 18 are further integrated on the MMIC substrate 1. An earth conductor is also formed on the whole back surface of the MMIC substrate 1.

The resistor 12a serves to determine a drain-source voltage $V_{DS}$ between the drain and source of the FET 11, and the resistor 12b serves as a self-biasing resistor to determine a drain current $I_D$ of the FET 11. The capacitor 13d serves as a series feedback capacitor to determine an oscillating frequency of the oscillating circuit. If the capacitance of the capacitor 13d is set to such a value that impedance viewed from the drain end of the FET 11 is negative, the circuit thus constructed is operated as an oscillating circuit. The output matching circuit 16 comprises three stubs and the capacitor 13b serves to maximize an oscillation output, and each of the capacitors 13a and 13c serves as a bypass capacitor. Each of the $\lambda_g/4$ lines 15a and 15b is inserted so as to serve as an infinite resistance to a signal frequency.

The strip line 17 whose one end is connected to the gate of the FET 11 is crooked several times (i.e. reciprocally winds) at the other end thereof near the edge of the MMIC substrate 1, whereby the strip line 17 adjacently approches the dielectric resonator 5 at a plurality of portions thereof (portions expanding along the edge in the crooked structure in FIG. 3) to obtain a desired coupling degree between the strip line 17 and the dielectric resonator 5. In FIG. 3, a, b, c and d represent coupling points between the dielectric resonator 5 and the respective portions expanding along the edge in the crooked reciprocally wound) structure as shown in FIG. 3. If the crooked structure is designed so as to satisfy the following condition: the length between each of the coupling points and the FET 11 is equal to a predetermined length which is determined in accordance with a well-known rule as disclosed in "1989 IEEE MTS-S Digest KK-5 (pp 1033–1036)", or is equal to a length obtained by adding the predetermined length with an integer of $\lambda_g/2$ where $\lambda_g$ represents the wavelength on the GaAs substrate of the oscillating frequency, electromagnetic waves reflected from the dielectric resonator 5 would arrive at the FET 11 in-phase, and then be reflected from the FET 11 again.

That is, in representing the length of the microstrip line between the points a and f, the length between b and f, the length between the points c and f and the length between d and f by $L_{af}$, $L_{bf}$, $L_{cf}$ and $L_{df}$ respectively, $L_{bf}$, $L_{cf}$ and $L_{df}$ are then represented by the following equation: $L_{af}+k\lambda_g/2$ (k is a natural number).

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. An oscillating circuit comprising:
    a substrate;
    a FET formed on said substrate;
    a series feedback capacitor connected to a source of said FET and formed on said substrate;
    a microstrip line being connected to a gate of said FET on said substrate and being formed so as to reciprocally wind several times near an edge of said substrate to provide plural portions which extend along the edge; and
    a dielectric resonator electromagnetically coupled to said microstrip line and located near said microstrip line.

2. The oscillating circuit according to claim 1, wherein said microstrip line electromagnetically coupled to said dielectric resonator has a coupling point for each of said plural portions extending along the edge, and wherein a distance between the coupling point and a connecting point of said microstrip line and the gate of said FET is defined by the following equation:

$$L+k\lambda_g/2$$

where L represents a suitable constant, k represents an integer greater than zero $\lambda_g$ represents an oscillating frequency wavelength.

3. The oscillating circuit according to claim 1, wherein said dielectric resonator is disposed at a location so as to be electromagnetically coupled to said microstrip line.

4. An oscillating circuit comprising:
    a FET formed on a substrate;
    a series feedback capacitor connected to a source of said FET and formed on said substrate;
    a microstrip line connected to a gate of said FET and formed on said substrate; and
    a dielectric resonator located near said microstrip line so as to be electromagnetically coupled to said microstrip line,
    said microstrip line being electromagnetically coupled to said dielectric resonator and having plural portions which reciprocally wind near an edge of said substrate and a coupling point for each of said plural portions extending along the edge, a distance between the coupling point and a connecting point of said microstrip line and the gate of said FET being defined by the following equation:

$$L+k\lambda_g/2$$

where L represents a suitable constant, k represents an integer above zero and $\lambda_g$ represents the wavelength on said substrate of an oscillation frequency.

5. An oscillating circuit comprising:

a substrate;

a FET formed on said substrate;

a series feedback capacitor connected to a source terminal of said FET and formed on said substrate;

a microstrip line connected to a gate of said FET and formed on said substrate; and a dielectric resonator electromagnetically coupled to said microstrip line, wherein said dielectric resonator and said substrate are mounted on another substrate;

wherein said microstrip line electromagnetically coupled to said dielectric resonator is formed so as to have a reciprocally winding structure near the edge of said substrate to provide plural portions extending along the edge.

* * * * *